US011828955B2

(12) United States Patent
Lim et al.

(10) Patent No.: US 11,828,955 B2
(45) Date of Patent: Nov. 28, 2023

(54) POSITION SENSING CIRCUIT AND POSITION CONTROL DEVICE WITH DIFFERENTIAL SENSING STRUCTURE

(71) Applicant: SAMSUNG ELECTRO-MECHANICS CO., LTD., Suwon-si (KR)

(72) Inventors: Joon Hyung Lim, Suwon-si (KR); Chang Seok Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 449 days.

(21) Appl. No.: 17/192,996

(22) Filed: Mar. 5, 2021

(65) Prior Publication Data
US 2022/0128834 A1    Apr. 28, 2022

(30) Foreign Application Priority Data

Oct. 28, 2020  (KR) .......................... 10-2020-0141217

(51) Int. Cl.
*G02B 27/64*    (2006.01)
*H03B 5/12*    (2006.01)
(Continued)

(52) U.S. Cl.
CPC .......... *G02B 27/646* (2013.01); *G01D 5/2275* (2013.01); *G02B 7/02* (2013.01);
(Continued)

(58) Field of Classification Search
CPC ............. G02B 27/646; H04N 23/6812; G01D 5/2275; G03B 5/00; G03B 2205/0069; H03B 5/1215; H03B 5/1228
See application file for complete search history.

(56) References Cited

U.S. PATENT DOCUMENTS

2005/0168584 A1    8/2005  Uenaka
2018/0095341 A1    4/2018  Lee et al.
(Continued)

FOREIGN PATENT DOCUMENTS

CN    209356737 U  *  9/2019  .......... G02B 27/646
EP    0 896 205 A1     2/1999
(Continued)

OTHER PUBLICATIONS

Korean Office Action dated Oct. 18, 2021 in corresponding Korean Patent Application No. 10-2020-0141217 (7 pages in English and 5 pages in Korean).

*Primary Examiner* — Minh Q Phan
(74) *Attorney, Agent, or Firm* — NSIP Law

(57) ABSTRACT

A position sensing circuit that can be used with a position control device including a differential sensing coil unit having a first sensing coil and a second sensing coil disposed to face a conductor disposed on one side of a lens barrel. The position sensing circuit includes: a differential oscillation circuit generating a first oscillation signal having a first amplitude based on a first inductance of the first sensing coil, variable according to positional movement of the conductor, and a second oscillation signal having a second amplitude based on a second inductance of the second sensing coil, variable according to positional movement of the conductor; an amplitude detection circuit detecting the first amplitude of the first oscillation signal and the second amplitude of the second oscillation signal; and a signal processing circuit calculating the first amplitude and the second amplitude to calculate a position value.

20 Claims, 7 Drawing Sheets

(51) Int. Cl.
*G03B 5/00* (2021.01)
*G01D 5/22* (2006.01)
*G02B 7/02* (2021.01)
*H04N 23/68* (2023.01)

(52) U.S. Cl.
CPC ............ *G03B 5/00* (2013.01); *H03B 5/1212* (2013.01); *H03B 5/1215* (2013.01); *H03B 5/1228* (2013.01); *H04N 23/6812* (2023.01); *G03B 2205/0007* (2013.01); *G03B 2205/0069* (2013.01)

(56) References Cited

U.S. PATENT DOCUMENTS

2019/0154955 A1   5/2019   Pang et al.
2020/0204114 A1   6/2020   Lee

FOREIGN PATENT DOCUMENTS

| JP | 9-304352 A | 11/1997 |
| JP | 2005-215454 A | 8/2005 |
| JP | 4367966 B2 | 11/2009 |
| KR | 10-2018-0037879 A | 4/2018 |
| KR | 10-2019-0059101 A | 5/2019 |
| KR | 10-2020-0077137 A | 6/2020 |

\* cited by examiner

POSITION SENSING CIRCUIT AND POSITION CONTROL DEVICE WITH DIFFERENTIAL SENSING STRUCTURE

CROSS-REFERENCE TO RELATED APPLICATION(S)

This application claims the benefit under 35 USC 119(a) of Korean Patent Application No. 10-2020-0141217 filed on Oct. 28, 2020 in the Korean Intellectual Property Office, the entire disclosure of which is incorporated herein by reference for all purposes.

BACKGROUND

1. Field

The following description relates to a position sensing circuit and a position control device with a differential sensing structure.

2. Description of Background

In general, a camera module may include a lens barrel including a plurality of lenses, an autofocusing (AF) device driving the lens barrel in an optical axis (usually, a Z axis direction), and an optical image stabilizer (hereinafter referred to as "OIS") device driving the lens barrel in two directions, orthogonal to the optical axis (Z axis) (usually, in X and Y directions, hereinafter referred to as an "X-Y vertical axis") and correcting hand-shake.

In order to increase a degree of driving precision of the OIS device, a position measurement sensor for each of the optical axis (e.g., Z axis) and vertical axis (e.g., X axis and/or Y axis) is required, to measure the position of the lens barrel.

As an example, a hall sensor or a photo reflector (PR) sensor may be used as the position measurement sensor, and recently, a sensing method using a coil inductance may be employed instead of a hall sensor or a photo reflector (PR) sensor.

The conventional coil inductance sensing method is a method of detecting a position of a lens barrel by counting a frequency change of an oscillator according to a change in the coil inductance.

However, in order to improve sensing capability of the conventional coil inductance sensing method, when two sensing coils are used, two oscillation circuits are required to process the inductance of each of the two sensing coils without interference with each other, such that there is a problem that the device becomes more complicated.

In addition, when two oscillation circuits are used in the existing position sensing device, there is a frequency difference in the oscillation signals generated by the two oscillation circuits, and the two oscillation signals are separated from each other, so that an error occurs during temperature compensation.

Meanwhile, in the position sensing device using one single coil and one oscillation circuit, when an inductance (L) of the single coil is varied with respect to positional movement of the conductor, a oscillation frequency is varied in an oscillation frequency equation $$\left( f = \frac{1}{(2\pi\sqrt{L*C})} \right),$$

so if the varied oscillation frequency is measured, a variable position value may be confirmed.

However, such a conventional single coil sensing method, as described above, requires two oscillation circuits, two frequency counters, two operation circuits, and the like, so that the circuit is complicated, and accordingly, there is a problem in which manufacturing costs and device occupation areas are increased.

In addition, in the conventional position sensing device using the two coils and two oscillator structures, in order to avoid mutual interference of the differential signals generated by the two oscillators, oscillation frequencies of the two oscillation signals are different from each other. In this case, there is a problem that the noise and temperature characteristics are not the same between the two coils, such that there may be a problem that an error may occur during temperature compensation.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A position sensing circuit and a position control device having a differential sensing structure. A position of a lens barrel may be detected by detecting a change in inductance according to positional movement of a conductor disposed in the lens barrel, and accordingly, common noise may be removed, and temperature compensation may be performed.

In one general aspect, a position sensing circuit is used with a position control device including a differential sensing coil unit having a first sensing coil and a second sensing coil disposed to be spaced apart from a conductor disposed on one side of a lens barrel, the position sensing circuit including: a differential oscillation circuit generating a first oscillation signal having a first amplitude based on a first inductance of the first sensing coil, which is variable according to positional movement of the conductor, and a second oscillation signal having a second amplitude based on a second inductance of the second sensing coil, which is variable according to positional movement of the conductor; an amplitude detection circuit for detecting a first amplitude of the first oscillation signal and a second amplitude of the second oscillation signal; and a signal processing circuit for calculating a position value by calculating the first amplitude and the second amplitude.

The position sensing circuit may include a position controller configured to control a position of the conductor based on the position value.

The first inductance may be an inductance of the first sensing coil having one end connected to one end of the differential oscillation circuit and the other end connected to a ground terminal of the differential oscillation circuit, and the second inductance may be an inductance of the second sensing coil having one end connected to the other end of the differential oscillation circuit and the other end connected to the ground terminal. A sum of the first inductance and the second inductance may maintain a constant value regardless of the positional movement of the conductor.

The differential oscillation circuit may include a capacitor circuit connected to one end of the first sensing coil and one end of the second sensing coil to form a resonance circuit together with the first sensing coil and the second sensing coil; and an oscillation circuit connected to the capacitor circuit, and configured to generate the first oscillation signal and the second oscillation signal having opposite phases.

The amplitude detection circuit may include one of an amplitude demodulator and a frequency down conversion mixer.

The signal processing circuit may include an A/D converter configured to convert the first amplitude and the second amplitude into a digital first amplitude and a digital second amplitude; and an operation circuit configured to compensate for common distortion and to calculate the position value by calculating the digital first amplitude and the digital second amplitude input from the A/D converter.

The operation circuit may be configured to calculate the position value (PV) according to PV=(VOP−VON)/(VOP+VON), where VOP is the digital first amplitude and VON is the digital second amplitude.

The position sensing circuit may include a calibration circuit configured to correct a variation of a corresponding value by monitoring a variation of at least one of inductance, capacitance, and resistance of the differential sensing coil unit.

In another general aspect, a position control device includes: a differential sensing coil unit having a first inductance and a second inductance, which are variable (increased or decreased) opposite to each other, according to positional movement of a conductor disposed on one side of a lens barrel; a differential oscillation circuit connected to the differential sensing coil unit, and generating a first oscillation signal having a first amplitude based on the first inductance and a second oscillation signal having a second amplitude based on the second inductance; an amplitude detection circuit for detecting a first amplitude of the first oscillation signal and a second amplitude of the second oscillation signal; and a signal processing circuit for calculating a position value by calculating the first amplitude and the second amplitude.

The position control device may include a position controller configured to control a position of the conductor based on the position value.

An intermediate connection node may be connected to a ground terminal at an intermediate connection position between the first sensing coil and the second sensing coil.

In another general aspect, a camera module includes: a lens barrel; a lens module accommodated within the lens barrel; a conductor disposed on a side of the lens barrel; a first inductor disposed to face the conductor and configured to generate a first inductance that is variable according to positional movement of the conductor; a second inductor disposed to face the conductor and configured a generate a second inductance that is variable according to the positional movement of the conductor such that a sum of the first inductance and the second inductance remains constant; circuitry configured to generate a position value associated with the conductor based on the first inductance and the second inductance; and a controller configured to control a position of the conductor based on the position value.

The circuitry may be configured to generate a first oscillation signal having a first amplitude based on the first inductance, to generate a second oscillation signal having a second amplitude based on the second inductance, and to calculate the position value based on the first amplitude and the second amplitude.

The first inductor and the second inductor may be connected to a common connection node and the connection node may be grounded.

The first inductor and the second inductor may be spaced apart from each other along a direction that is orthogonal to a direction along which the first inductor and the second inductor face the conductor.

Other features and aspects will be apparent from the following detailed description, the drawings, and the claims.

Figure 10:
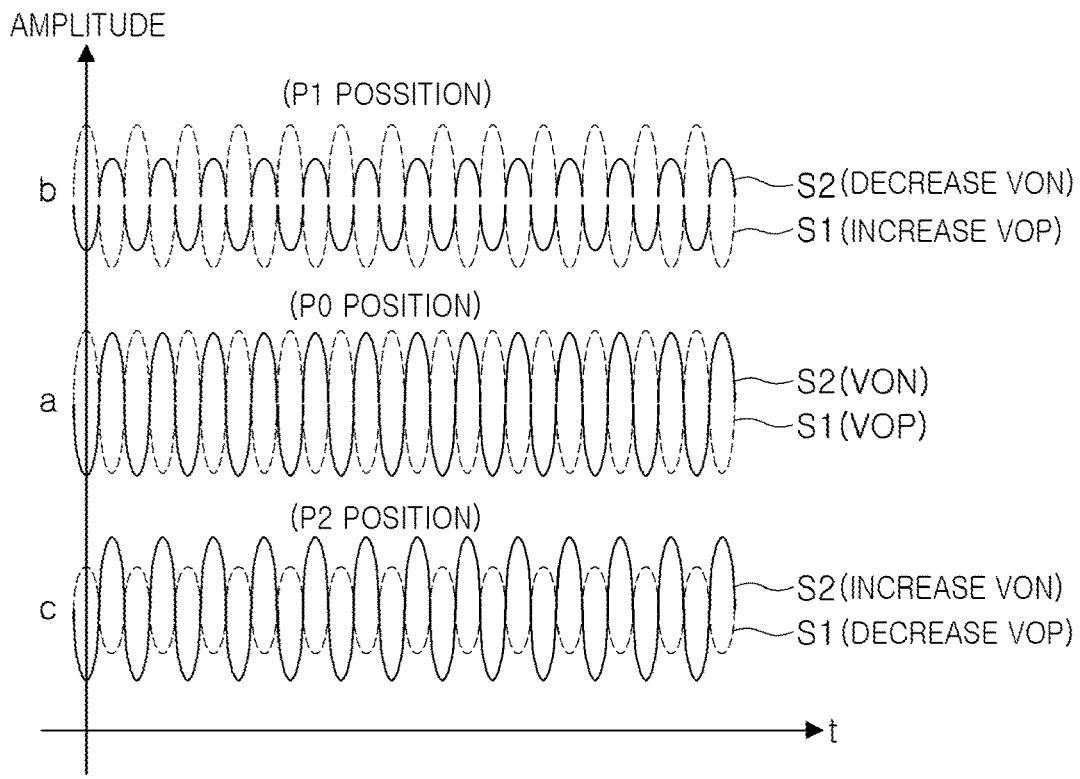

Graphs (a), (b), and (c) of FIG. 10 are diagrams of amplitudes for a first oscillation signal and a second oscillation signal.

Figure 11:
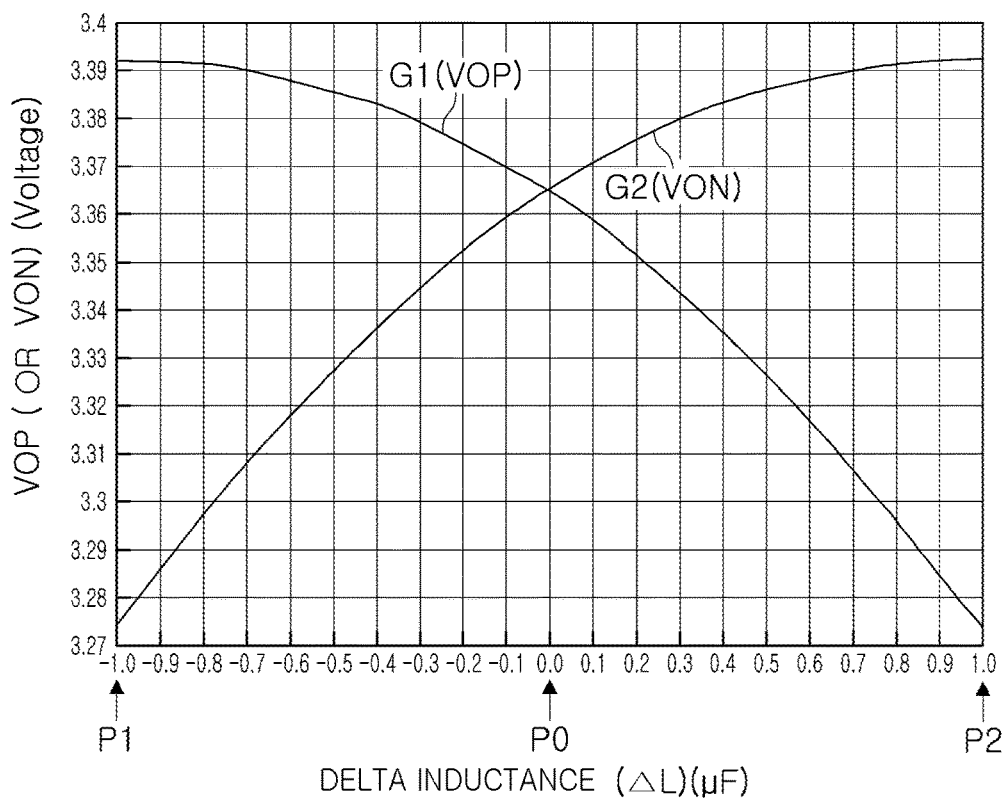

FIG. 11 is a graph illustrating a relationship between a delta inductance (ΔL) of a first coil-a first amplitude, and a delta inductance (ΔL) of a second coil-a second amplitude.

Figure 12:
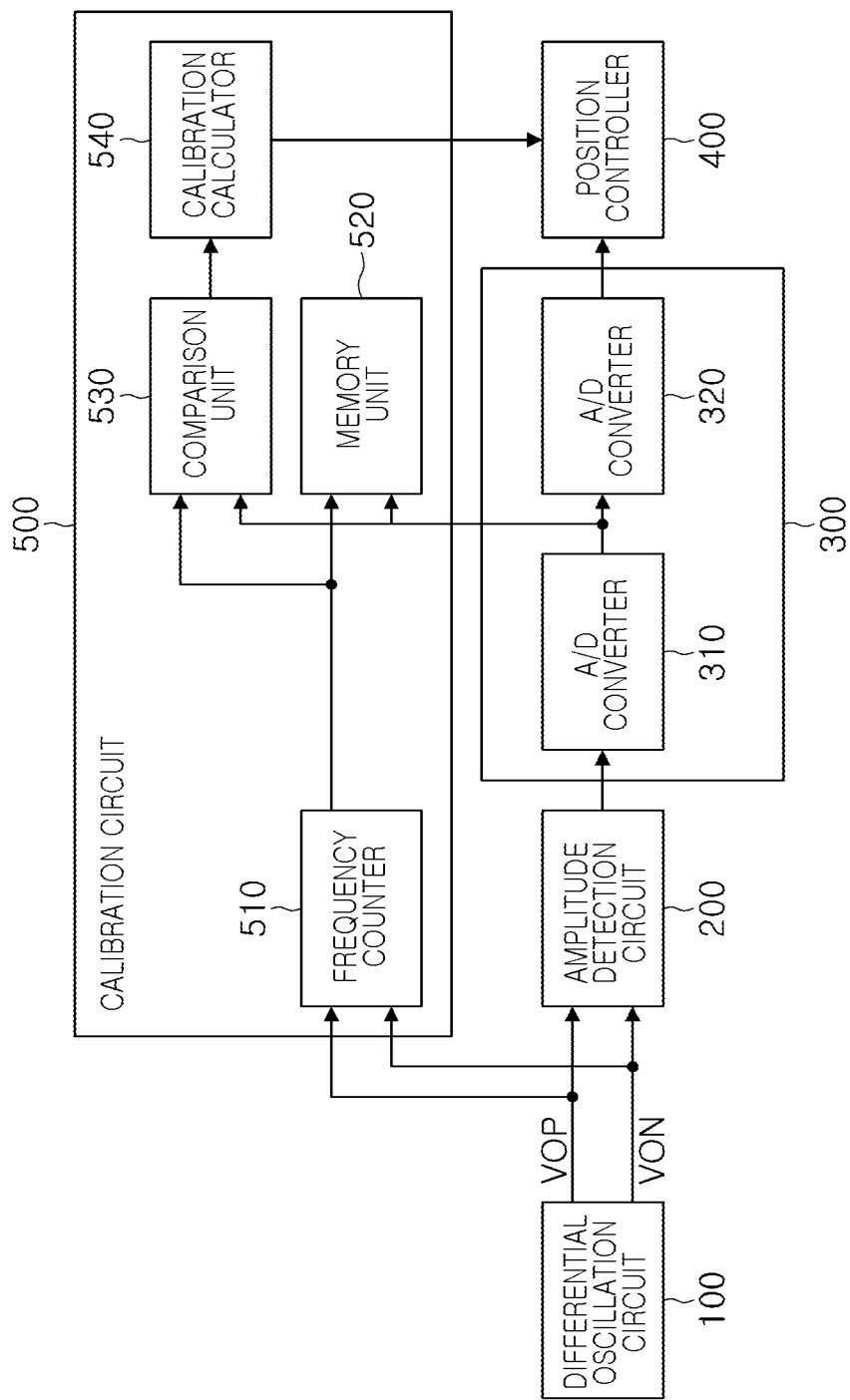

FIG. 12 is a diagram of a calibration circuit for a differential oscillation signal.

Throughout the drawings and the detailed description, the same reference numerals refer to the same elements. The drawings may not be to scale, and the relative size, proportions, and depictions of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

Figure 1:
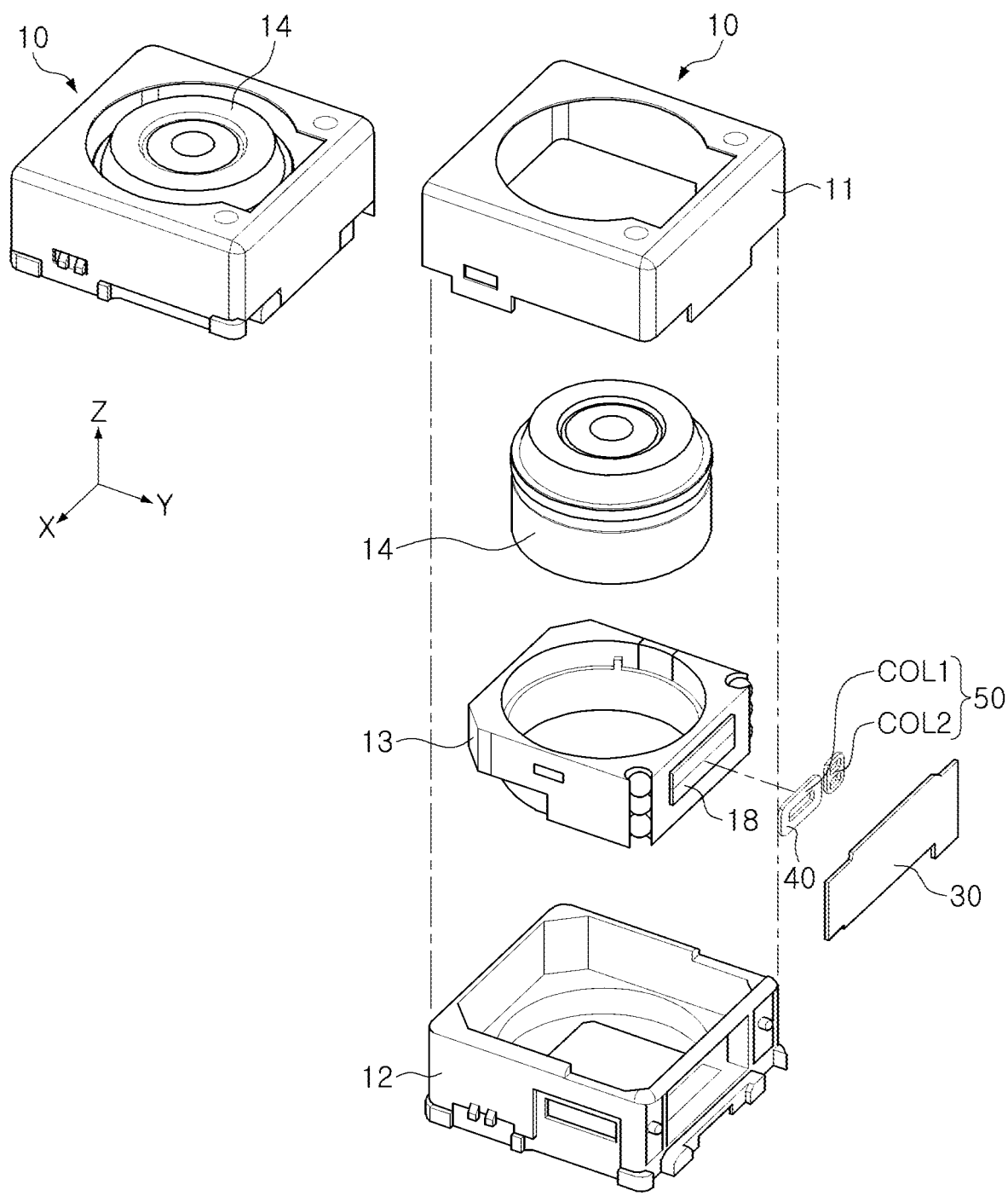
FIG. 1 is a configurational block diagram of a camera module according to an example.

FIG. 1 is a configurational block diagram of a camera module according to an example.

Referring to FIG. 1, a camera module 10 may include a case 11, a housing 12, a lens barrel 13 a conductor 18, a driving coil 40, and a differential sensing coil unit 50.

The case 11 may be coupled to the housing 12, and the housing 12 may be coupled to the case 11, and may include an internal accommodation space.

For example, the case 11 may include a metal material or may be made of a metal material and may be grounded to a ground pad of a substrate mounted below the housing 12, and accordingly, electromagnetic waves generated during driving of the camera device may be shielded.

The lens barrel 13 may be disposed in an accommodation space of the housing 12 and disposed along an optical axis to embed a lens module 14 including a plurality of lenses.

The conductor 18 may be disposed outside of a portion of the lens barrel 13. For example, the conductor 18 may be a member including a magnetic material, or may be a dielectric material or a magnet.

The driving coil 40 may be mounted on a substrate 30 disposed on the housing 12, and the driving coil 40 may face the conductor 18. Here, the driving coil 40 may be a coil for driving. For example, when a driving current flows through the driving coil 40, driving force may be transmitted to the conductor 18 by electromagnetic force generated by the driving coil 40, so that a position of the conductor 18 may be moved, and accordingly, the position of the lens module 14 in the lens barrel 13 to which the conductor 18 is attached may be moved in a direction of an optical axis (e.g., an Z axis) or a direction of a vertical axis (e.g., an X axis, a Y axis).

The differential sensing coil unit 50 may be mounted on the substrate 30 adjacent to the driving coil 40, and may include a first sensing coil COL1 and a second sensing coil COL2 disposed adjacent to each other.

For example, the first sensing coil COL1 and the second sensing coil COL2 may be spaced apart from the conductor 18 by a certain distance, for example, when the position of the conductor 18 is moved, an inductance of each of the first sensing coil COL1 and the second sensing coil COL2 included in the differential sensing coil unit 50 may be varied, due to interaction of electromagnetic force between the differential sensing coil unit 50 and the conductor 18.

Figure 2:
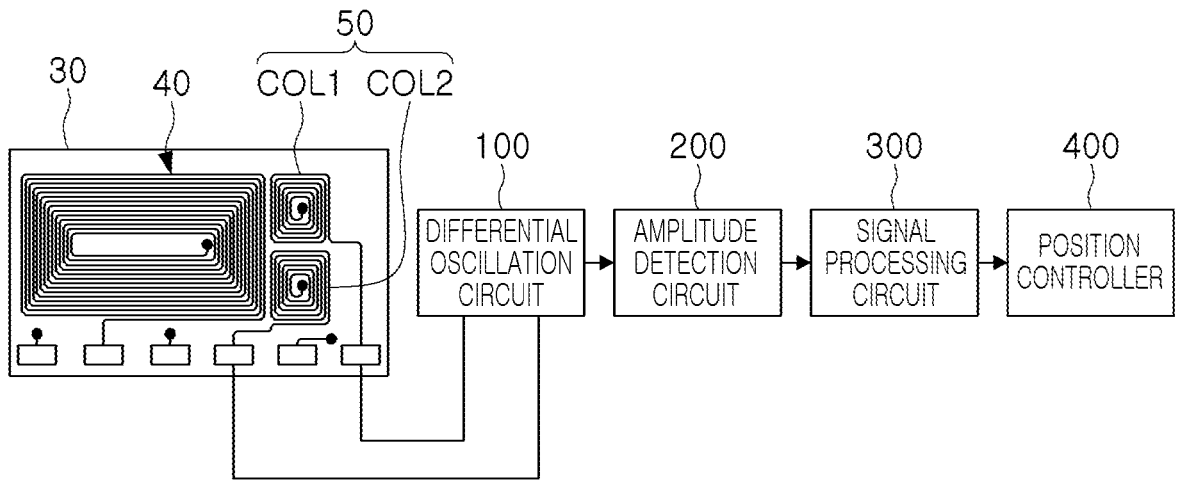
FIG. 2 is an exemplary view of a position control device according to an example.

Based on the variation of the inductance, the differential oscillation circuit 100 in FIG. 2 may generate first and second differential signals S1 and S2, and then the position of the conductor 18 may be detected based on the first and second differential signals S1 and S2 in circuits 200, 300, and 400 in FIG. 2.

The position detection operation of the conductor 18 will be described with reference to FIGS. 2 to 12.

For each drawing, unnecessary redundant descriptions of components having the same reference numerals and the same functions may be omitted, and possible differences may be described for each drawing.

FIG. 2 is an exemplary view of a position control device according to an example.

Referring to FIG. 2, a position control device may include a differential sensing coil unit 50 and position sensing circuits 100, 200, 300, and 400.

Referring to FIGS. 1 and 2, the differential sensing coil unit 50 may include a first sensing coil COL1 and a second sensing coil COL2 disposed to be spaced apart to face a conductor 18 disposed on one side of a lens barrel 13.

Accordingly, the first sensing coil COL1 and the second sensing coil COL2 may include a first inductance L1 and a second inductance L2, which are variable (increased or decreased) opposite to each other according to the positional movement of the conductor 18.

As an example, when the first inductance L1 increases, the second inductance L2 may decrease. As another example, when the first inductance L1 decreases, the second inductance L2 may increase.

Figure 3:
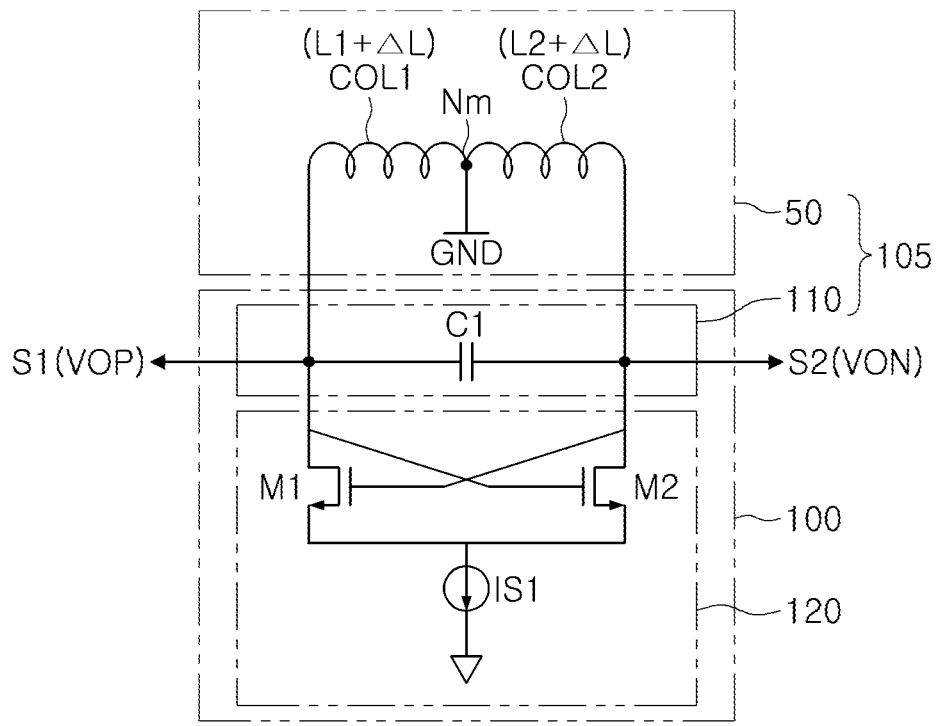
FIG. 3 is a diagram of a differential sensing coil unit and a differential oscillation circuit of FIG. 2.

Referring to FIGS. 2 and 3, the position sensing circuits 100, 200, 300, and 400 may include a differential oscillation circuit 100, an amplitude detection circuit 200, a signal processing circuit 300, and a position controller 400.

The differential oscillation circuit 100 may be connected to the differential sensing coil unit 50, and may generate a first oscillation signal S1 having a first amplitude VOP, based on a first inductance L1 of the first sensing coil COL1, which is variable according to positional movement of the conductor 18, and may generate a second oscillation signal S2 having a second amplitude VON, based on a second inductance L2 of the second sensing coil COL2, which is variable according to positional movement of the conductor 18.

The amplitude detection circuit 200 may detect a first amplitude VOP of the first oscillation signal S1 and a second amplitude VON of the second oscillation signal S2.

For example, the first amplitude VOP and the second amplitude VON may be detected from the first oscillation signal S1 and the second oscillation signal S2, by a rectification method or a frequency conversion method.

The signal processing circuit 300 may calculate a position value by calculating the first amplitude VOP and the second amplitude VON.

For example, the position value PV may be a difference (VOP−VON) between the first amplitude VOP and the second amplitude VON. As another example, the position value PV may be obtained by calculating the difference (VOP−VON) and a sum (VOP+VON) between the first amplitude VOP and the second amplitude VON.

The position controller 400 may control the position of the conductor 18 based on the position value PV. For example, a control signal may be generated based on a difference value between a predetermined target value and the position value PV.

FIG. 3 is a diagram of a differential sensing coil unit and a differential oscillation circuit of FIG. 2.

Referring to FIG. 3, the differential sensing coil unit 50 may include a first sensing coil COL1, a second sensing coil COL2, and an intermediate connection node Nm.

The first sensing coil COL1 has one end connected to one end of the differential oscillation circuit 100, and the other end connected to a ground terminal GND through the intermediate connection node Nm, and may provide the first inductance L1, which is variable according to the positional movement of the conductor 18.

The second sensing coil COL2 has one end connected to the other end of the differential oscillation circuit 100, and the other end connected to the ground terminal GND through the intermediate connection node Nm, and may provide the second inductance L2, which is variable opposite to the variation of the first inductance L1 according to the positional movement of the conductor 18.

For example, when the first inductance L1 increases as the position of the conductor 18 moves in any one direction, the second inductance L2 may decrease. Conversely, as the conductor 18 moves in the other direction, when the first inductance L1 decreases, the second inductance L2 may increase.

Accordingly, a sum of inductances L1+L2 of the first inductance L1 and the second inductance L2 can be maintained at a constant value regardless of the positional movement of the conductor 18. The oscillation frequency of the differential oscillation circuit 100 determined based on the sum of inductances L1+L2 as described above may be constant.

The intermediate connection node Nm is a connection node located in a middle of the first sensing coil COL1 and the second sensing coil COL2, and may be connected to the ground terminal GND.

The differential oscillation circuit 100 may include a capacitor circuit 110 and an oscillation circuit 120.

The capacitor circuit 110 may include a capacitor C1 connected between one end of the first sensing coil COL1 and one end of the second sensing coil COL2. The capacitor C1 may form a resonance circuit 105 together with the first sensing coil COL1 and the second sensing coil COL2.

$$f = \frac{1}{\left(2\pi\sqrt{(L1+L2)*C}\right)} \qquad \text{Equation 1}$$

The oscillation circuit 120 may include drain gate cross-coupled transistors M1 and M2 to oscillate a signal including a resonance frequency generated by the resonance circuit 105, and a current source IS1 connected between a common source node of the transistors M1 and M2 and a ground.

The oscillation circuit 120 may be connected to the capacitor circuit 110, to generate the first oscillation circuit S1 and the second oscillation signal S2 having opposite phases to each other.

The first oscillation signal S1 may include a first amplitude VOP based on a first inductance L1 of the first sensing coil COL1. The second oscillation signal S2 may include a second amplitude VON based on a second inductance L2 of the second sensing coil COL2.

For example, the first amplitude and the second amplitude may be related to the first inductance L1 and the second inductance L2 as shown in Equations 2 and 3 below.

$$VOP = Ip \times R1 = Ip \times (L1)/[(r1+r2) \times C] \qquad \text{Equation 2}$$

$$VON = In \times R2 = In \times (L2)/[(r1+r2) \times C] \qquad \text{Equation 3}$$

In Equations 2 and 3, Ip is a current flowing through the transistor M1, and In is a current flowing through the transistor M2.

R1 is a resistance component determined by a magnitude of a series resistance r1 of the first sensing coil COL1, the first inductance L1, and the capacitance of the oscillation circuit 120, and R2 is a resistance component determined by a magnitude of a series resistance r2 of the second sensing coil COL2, the second inductance L2, and the capacitance of the oscillation circuit 120. C is the capacitance of the capacitor C1.

In addition, the magnitudes of the inductances L1 and L2 and the resistances r1 and r2 are differentially changed according to the positional movement of the conductor 18, and by these variation values, the amplitudes that the magnitudes of R1 and R2 are changed in the Equations 2 and 3 according to changes in the position of the conductor 18.

For example, as the position of the conductor 18 moves, as the electromagnetic force between the conductor 18 and the first sensing coil COL1 increases, and the electromagnetic force between the conductor 18 and the second sensing coil COL2 decreases, a first inductance L1 of the first sensing coil COL1 may decrease (L1−ΔL) and a second inductance L2 of the second sensing coil COL2 may increase (L1+ΔL), by the action of the electromagnetic force and the eddy current therebetween.

Meanwhile, in FIG. 3, a differential oscillation circuit including the drain-gate cross-coupled transistors M1 and M2 and the current source IS1 has been described as an example, but, since the differential oscillation circuit may have a structure capable of generating a differential oscillation signal, it is not limited to the example shown in FIG. 3.

Figure 4:
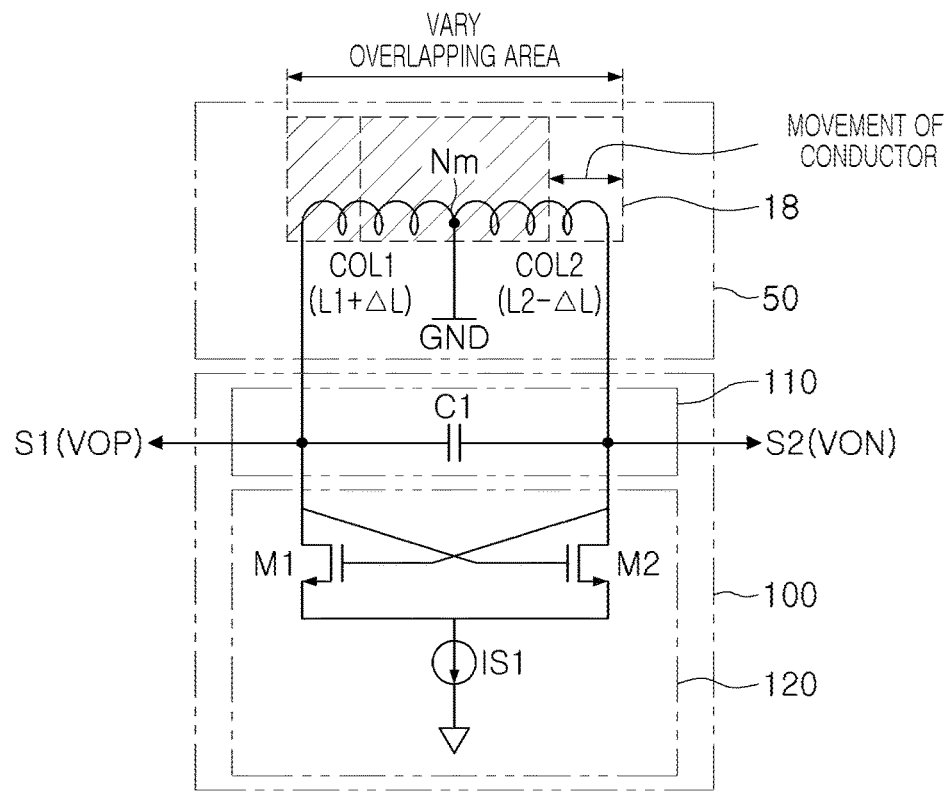
FIG. 4 is a view illustrating a structure of a differential sensing coil unit and a differential oscillation circuit of FIG. 2.

FIG. 4 is a diagram illustrating a structure of a differential sensing coil unit and a differential oscillation circuit of FIG. 2.

Referring to FIG. 4, a first sensing coil COL1 and a second sensing coil COL2 of the differential sensing coil unit 50 may be disposed such that an overlapping area with a conductor 18 may be variable (increased or decreased), according to positional movement of the conductor 18.

For example, as the position of the conductor 18 moves, as the overlapping area between the conductor 18 and the first sensing coil COL1 increases, and the overlapping area between the conductor 18 and the second sensing coil COL2 decreases, a first inductance L1 of the first sensing coil COL1 may decrease (L1−ΔL) and a second inductance L2 of the second sensing coil COL2 may increase (L1+ΔL) due to action of the electromagnetic force and eddy current therebetween.

Figure 5:
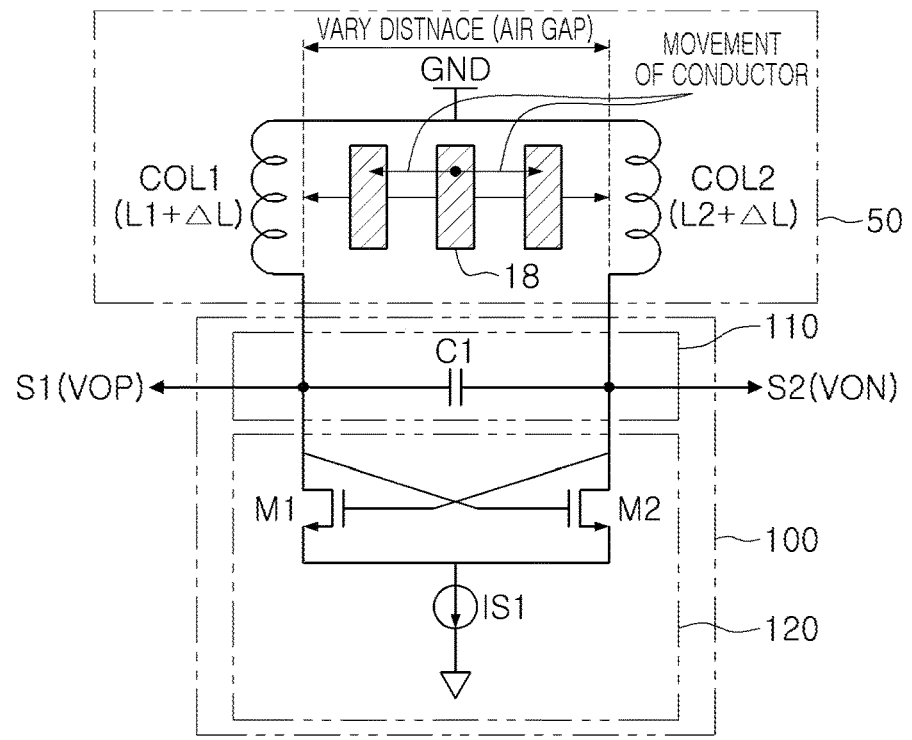
FIG. 5 is a view illustrating a structure of a differential sensing coil unit and a differential oscillation circuit of FIG. 2.

FIG. 5 is a view of a structure of a differential sensing coil unit and a differential oscillation circuit of FIG. 2.

Referring to FIG. 5, a first sensing coil COL1 and a second sensing coil COL2 of the differential sensing coil unit 50 may be disposed such that a distance (an air gap) with the conductor 18 may be varied (increased or decreased) according to the positional movement of the conductor 18.

For example, as the positional movement of the conductor 18, as a distance between the conductor 18 and the first sensing coil COL1 increases, and a distance (an air gap) between the conductor 18 and the second sensing coil COL2 decreases, a first inductance L1 of the first sensing coil COL1 may decrease (L1−ΔL) and a second inductance L2 of the second sensing coil COL2 may increase (L1+ΔL), by the action of the electromagnetic force and the eddy current therebetween.

A structure in which the inductance is variable according to the positional movement of the conductor 18 has been described as an example with reference to FIGS. 4 and 5, but an actual inductance variation may be caused by a change due to the overlapping area and distance between the conductor 18 and the sensing coil, and the structure and operation shown in FIGS. 4 and 5 are only examples to aid in an understanding of the present disclosure, and thus an example thereof is not limited thereto.

The amplitude detection circuit 200 may include one of an amplitude demodulator 210 and a frequency down conversion mixer 220. This will be described with reference to FIGS. 6 to 9.

Figure 6:
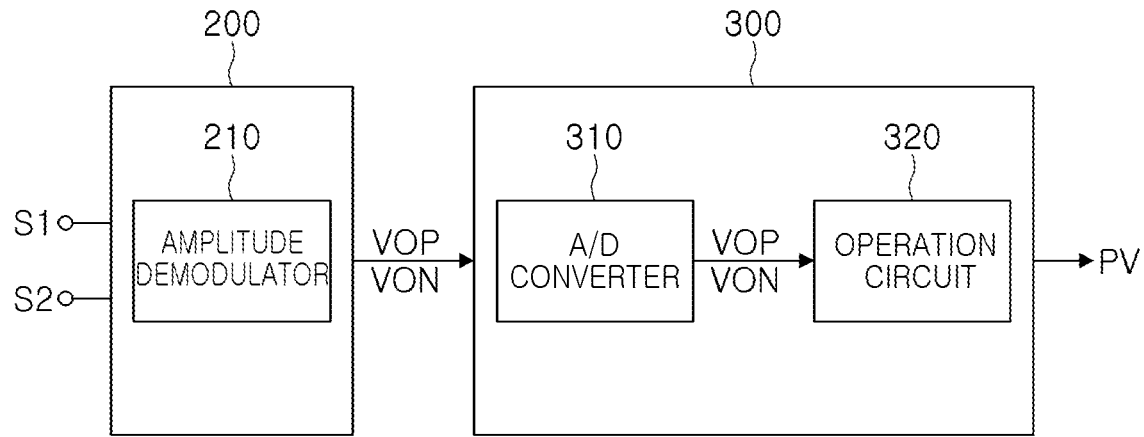
FIG. 6 is a diagram of an amplitude detection circuit and a signal processing circuit of FIG. 2.
Figure 7:
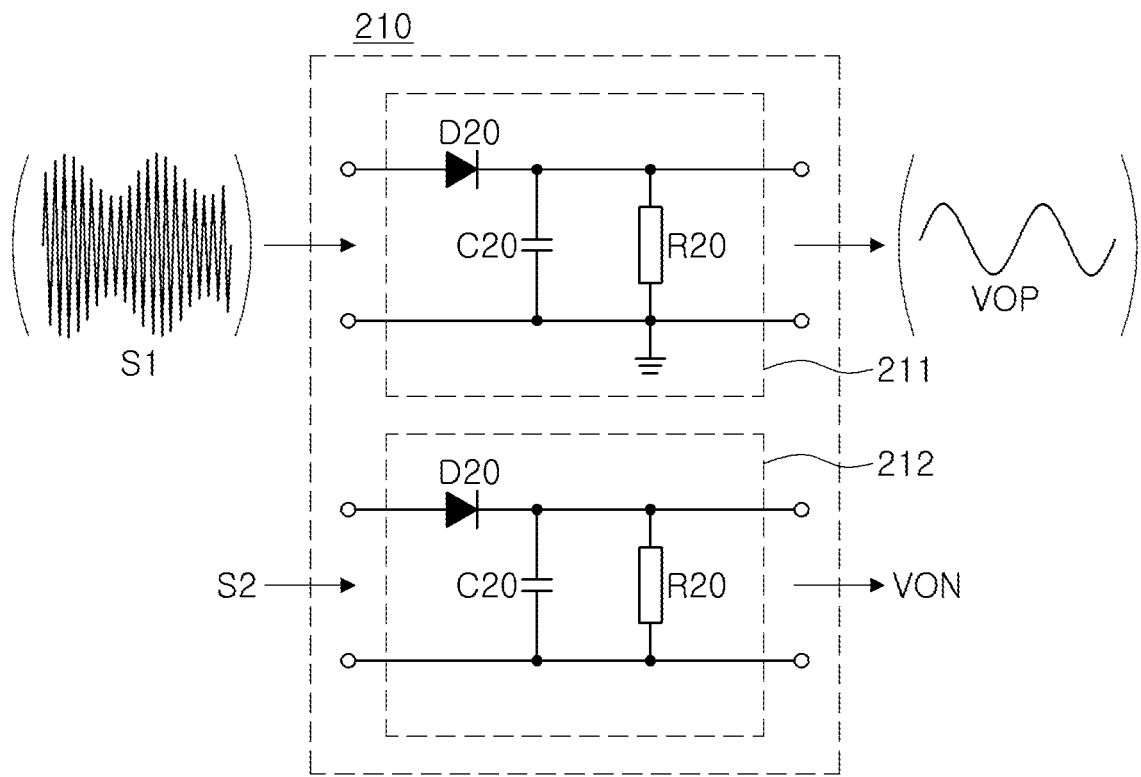
FIG. 7 is a diagram of the amplitude detection circuit of FIG. 6.

FIG. 6 is a diagram of the amplitude detection circuit and the signal processing circuit of FIG. 2, and FIG. 7 is a diagram of the amplitude detection circuit of FIG. 6.

Referring to FIGS. 6 and 7, the amplitude detection circuit 200 may include an amplitude demodulator 210.

For example, the amplitude modulator 210 may include a first rectifying circuit 211, which includes a rectifying element D20, a capacitor C20, which is a passive element, and a resistor R20, and by using a rectifying function of the rectifying element D20, and a smoothing function of the capacitor C20, a first amplitude VOP of the first oscillation signal S1 S2 may be detected. Likewise, the amplitude modulator 210 may include a second rectifying circuit 212, which includes a rectifying element D20, a capacitor C20, which is a passive element, and a resistor R20, and by using a rectifying function of the rectifying element D20, and a smoothing function of the capacitor C20, a second amplitude VON of the second oscillation signal S2 may be detected.

The signal processing circuit 300 may include an A/D converter 310 and an operation circuit 320.

The ND converter 310 may convert the first amplitude (VOP) into a digital first amplitude (VOP), and convert the second amplitude (VON) into a digital second amplitude (VON).

The operation circuit 320 may calculate the digital first amplitude (VOP) and the digital second amplitude (VON) input from the ND converter 310, thereby compensating for common distortion and calculating a position value (PV).

For example, the operation circuit 320 may calculate the digital first amplitude VOP and the digital second amplitude VON as shown in Equation 4 below, to calculate a position value PV.

$$PV = (VOP - VON)/(VOP + VON) \quad \text{Equation 4}$$

As shown in Equation 4, when calculating the position value PV by calculating the digital first amplitude VOP and the digital second amplitude VON, a position value from which the common distortion is removed may be calculated.

Figure 8:
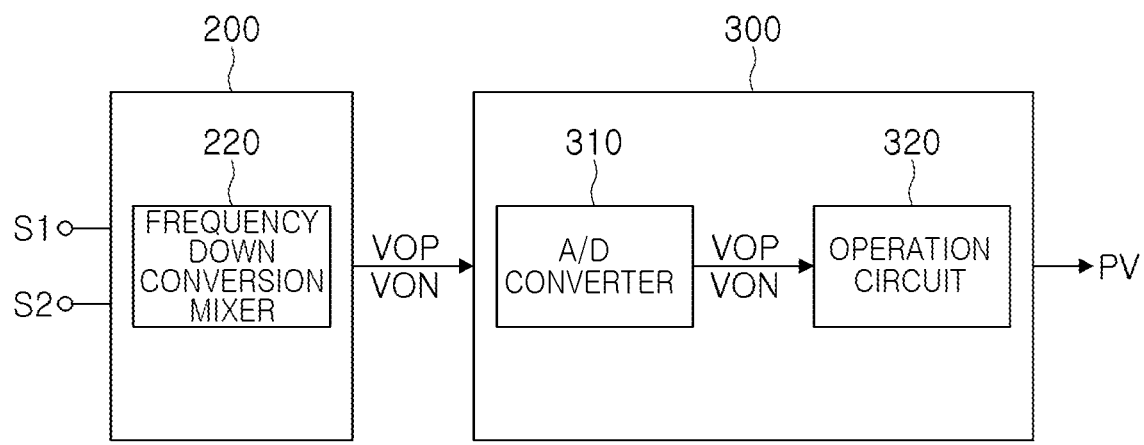
FIG. 8 is a diagram of the amplitude detection circuit and the signal processing circuit of FIG. 2.
Figure 9:
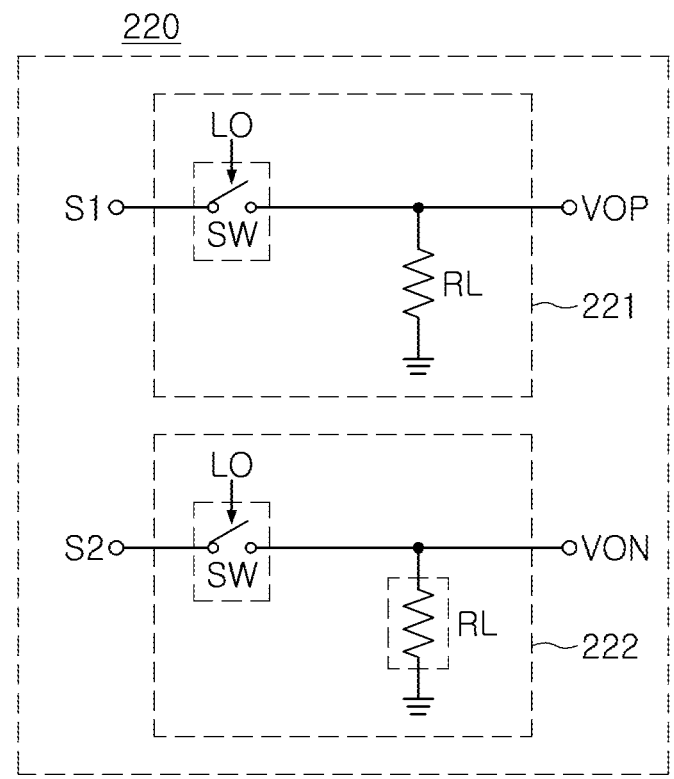
FIG. 9 is a view of the amplitude detection circuit of FIG. 8.

FIG. 8 is a diagram of the amplitude detection circuit and signal processing circuit of FIG. 2, and FIG. 9 is a diagram of the amplitude detection circuit of FIG. 8.

Referring to FIGS. 8 and 9, the amplitude detection circuit 200 may include a frequency down conversion mixer 220.

The frequency down conversion mixer 220 may include a first switching circuit 221 and a second switching circuit 222, which each include a switch element SW performing a switching operation according to a local mixer clock LO and a passive element RL, for each of the first oscillation signal S1 and the second oscillation signal S2, respectively. As the switch element SW performs a switching operation according to the local mixer clock (LO), the first amplitude VOP of the first oscillation signal S1 and the second amplitude VON of the second oscillation signal S2 may be detected.

Graphs (a), (b), and (c) of FIG. 10 are diagrams of amplitudes for a first oscillation signal and a second oscillation signal.

The graph (a) of FIG. 10 is a diagram of waveforms of the first oscillation signal S1 and the second oscillation signal S2 when the conductor 18 is located at the middle position PO. In the middle position, the amplitudes of the first oscillation signal S1 and the second oscillation signal S2 are the same, and the resonance frequencies thereof (freq=fo) are the same.

The graph (b) of FIG. 10 is a diagram of waveforms of the first oscillation signal S1 and the second oscillation signal S2 when the conductor 18 is positioned at a first position P1. In the first position P1, the amplitude VOP of the first oscillation signal S1 is greater than the amplitude VON of the second oscillation signal S2, and the resonance frequencies (freq=fo) of the two signals are the same.

The graph (c) of FIG. 10 is a diagram of waveforms of the first oscillation signal S1 and the second oscillation signal S2 when the conductor 18 is positioned in the second position P2. In the first position P1, the amplitude VOP of the first oscillation signal S1 is lower than the amplitude VON of the second oscillation signal S2, and the resonance frequencies (freq=fo) of the two signals are the same.

As described above, in the first position P1 according to the positions of the conductor 18, the amplitude (VOP) of the first oscillation signal S1 and the amplitude (VON) of the second oscillation signal S2 are varied, so that the position of the conductor 18 may be detected by using the amplitude VOP of the first oscillation signal S1 and the amplitude VON of the second oscillation signal S2.

FIG. 11 is a graph illustrating a relationship between delta inductance (ΔL) of a first coil-a first amplitude and delta inductance (ΔL) of a first coil-a second amplitude.

In FIG. 11, G1 is a graph of relationship between a delta inductance (ΔL) of the first coil and a first amplitude VOP of the first coil according to a position of the conductor 18 (e.g., a first position (P1), a middle position (P0), and a second position (P2)). G2 is a graph of a relationship between a delta inductance (ΔL) and a second amplitude VON of the first coil according to a position of the conductor 18 (e.g., a first position (P1), a middle position (P0), and a second position (P2)).

For example, the delta inductance (ΔL) may be an inductance, which is variable according to the position of the conductor 18 (e.g., the first position (P1), the middle position (PO), the second position (P2)) in the first coil COL1. In addition, if a size of an overlapping area of the middle position PO is middle, in the first position P1, there may be a case in which an overlapping area of the first coil COL1 and the conductor 18 is larger than the overlapping area of the middle position PO, and an overlapping area of the second coil COL2 and the conductor 18 may be smaller than the overlapping area of the middle position PO. It can be assumed that, in the second position P2, the overlapping area of the first coil COL1 and the conductor 18 is smaller than the second coil COL2 and the conductor 18, and the overlapping area of the second coil COL2 and the conductor 18 is larger than the overlapping area of the middle position PO.

Referring to G1 illustrated in FIG. 11, as the delta inductance ΔL increases, the first amplitude VOP may decrease according to a change in the overlapping area between the first coil COL1 and the conductor 18.

Referring to G2, according to a change in an overlapping area between the second coil COL2 and the conductor 18, as the delta inductance ΔL increases, the second amplitude VOP may increase.

In other words, an inductance variation amount (delta inductance) may be added to or subtracted from the first and second inductances L1 and L2 as a differential variation amount according to the positional movement of the conductor 18 facing the differential sensing coils COL1 and COL2. Thereby, the first and second amplitudes VOP and VON may be increased or decreased, and in the opposite positional movement, the first and second amplitudes VOP and VON may be decreased or increased.

FIG. 12 is a diagram of a calibration circuit for a differential oscillation signal.

Referring to FIG. 12, a position control device may further include a calibration circuit 500.

The calibration circuit 500 may monitor a variation of at least one of an inductance (Ls), a capacitance (Cs), and a resistance (Rs) of the differential sensing coil unit 50 to correct a variation in a corresponding value.

For example, the calibration circuit 500 may include a frequency counter 510, a memory unit 520, a comparison unit 530, and a calibration calculator 540.

The frequency counter 510 may count the oscillation frequencies of each of the first and second oscillation signals S1 and S2 to provide first and second frequency count values.

The memory unit 520 may store the first and second frequency count values obtained at a predetermined reference position and the first and second amplitudes VOP and VON as reference values at the beginning of driving.

The comparison unit 530 may receive frequency first and second count values obtained at a predetermined reference position and first and second amplitude values, during a periodic or sensing check mode period, for comparison with the corresponding reference value stored in the memory unit 520, to determine whether there is a change therebetween.

The calibration calculator 540 may calibrate a position value PV detected by the position controller 400, when a variation of a predetermined value or more occurs as a result of the comparison by the comparison unit 530.

Accordingly, even if initial model values of the first and second coils fluctuate by a certain amount due to long-term use of the first and second sensing coil units 50, it is monitored so that there is no problem in a control operation of a position controller, and thus a correction value may be provided to the position controller, such that fluctuation of the position value can be corrected.

Meanwhile, the position controller of the position control device according to the various examples may be implemented in a computing environment in which a processor (e.g., a central processing unit (CPU), a graphics processor (GPU), a microprocessor, an application specific integrated circuit (ASIC), a field programmable gate array (FPGA)), a memory (a volatile memory (e.g., a RAM), a non-volatile memory (e.g., a ROM and a flash memory), an input device (e.g., a keyboard, a mouse, a pen, a voice input device, a touch input device, an infrared camera, a video input device, or the like), an output device (e.g., a display, a speaker, a printer, or the like), and a communications connection device (e.g., a modem, a network interface card (NIC), an integrated network interface, a wireless frequency transmitter/receiver, an infrared port, a USB connection device, or the like) are interconnected (e.g., peripheral component interconnect (PCI), USB, firmware (IEEE 1394), an optical bus structure, a network, or the like).

The computing environment may be implemented as a personal computer, a server computer, a handheld or laptop device, a mobile device (a mobile phone, a PDA, a media player, or the like), a multiprocessor system, a consumer electronic device, a mini-computer, a mainframe computer, and a distributed computing environment including an above-described random system or device, but is the various examples are not limited thereto.

As set forth above, according to various examples, a differential sensing structure is included, and by using an amplitude of a differential oscillation signal generated in the differential sensing structure according to positional movement of a conductor disposed in a lens barrel, a position of the lens barrel may be sensed, and accordingly, there is no frequency interference, common noise may be removed, and temperature compensation may be performed.

In addition, since one differential oscillation circuit shares two coils, frequency interference can be reduced by calculating a differential oscillation signal, common noise can be removed, and common noise can be effectively removed.

In particular, by using two coils and a differential oscillation circuit, the oscillation frequency is not variable even if the inductance of the two coils is variable when the position of the conductor moves, so there is no frequency interference between the two coils, and an amount of variation in the inductance of the two coils may be reflected in a variation in the amplitude of the differential oscillation signal, and the variation in the amplitude of the differential oscillation signal can be sensed to detect the positional movement of the conductor.

In addition, as the oscillators for the two coils are implemented as one differential oscillation circuit, the oscillation frequencies of the two coils are the same, which is advantageous for compensating for common distortion, and as the amplitude of the differential oscillation signal is used, the common noise and an amount of temperature variation can be canceled, and thus there is an advantage in that a precise position value can be detected in the distortion.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A position sensing circuit for use with a position control device, the position control device comprising a differential sensing coil unit having a first sensing coil and a second sensing coil disposed to be spaced apart from a conductor disposed on one side of a lens barrel, the position sensing circuit comprising:
    a differential oscillation circuit configured to generate a first oscillation signal having a first amplitude based on a first inductance of the first sensing coil, which is variable according to positional movement of the conductor, and to generate a second oscillation signal having a second amplitude based on a second inductance of the second sensing coil, which is variable according to positional movement of the conductor,
    an amplitude detection circuit configured to detect the first amplitude of the first oscillation signal and to detect the second amplitude of the second oscillation signal; and
    a signal processing circuit configured to detect a position value by calculating the first amplitude and the second amplitude.

2. The position sensing circuit of claim 1, further comprising a position controller configured to control a position of the conductor based on the position value.

3. The position sensing circuit of claim 1, wherein the first inductance is an inductance of the first sensing coil having one end connected to one end of the differential oscillation circuit and the other end connected to a ground terminal of the differential oscillation circuit, and the second inductance is an inductance of the second sensing coil having one end connected to the other end of the differential oscillation circuit and the other end connected to the ground terminal,
    wherein a sum of the first inductance and the second inductance maintains a constant value, regardless of the positional movement of the conductor.

4. The position sensing circuit of claim 3, wherein the differential oscillation circuit comprises a capacitor circuit connected to one end of the first sensing coil and one end of the second sensing coil to form a resonance circuit together with the first sensing coil and the second sensing coil; and
    an oscillation circuit connected to the capacitor circuit, and configured to generate the first oscillation signal and the second oscillation signal having opposite phases.

5. The position sensing circuit of claim 1, wherein the amplitude detection circuit comprises one of an amplitude demodulator and a frequency down conversion mixer.

6. The position sensing circuit of claim 1, wherein the signal processing circuit comprises:
    an A/D converter configured to convert the first amplitude and the second amplitude into a digital first amplitude and a digital second amplitude; and
    an operation circuit configured to compensate for common distortion and to calculate the position value by calculating the digital first amplitude and the digital second amplitude input from the ND converter.

7. The position sensing circuit of claim 6, wherein the operation circuit is configured to calculate the position value (PV) according to PV=(VOP−VON)/(VOP+VON), where VOP is the digital first amplitude and VON is the digital second amplitude.

8. The position sensing circuit of claim 1, further comprising a calibration circuit configured to correct a variation of a corresponding value by monitoring a variation of at least one of inductance, capacitance, and resistance of the differential sensing coil unit.

9. A position control device, comprising:
    a differential sensing coil unit having a first inductance and a second inductance, the first inductance and the second inductance being variable opposite to each other according to positional movement of a conductor disposed on one side of a lens barrel;
    a differential oscillation circuit connected to the differential sensing coil unit, and configured to generate a first oscillation signal having a first amplitude based on the first inductance, and to generate a second oscillation signal having a second amplitude based on the second inductance;
    an amplitude detection circuit configured to detect the first amplitude of the first oscillation signal and to detect the second amplitude of the second oscillation signal; and
    a signal processing circuit configured to detect a position value by calculating the first amplitude and the second amplitude.

10. The position control device of claim 9, further comprising a position controller configured to control a position of the conductor based on the position value.

11. The position control device of claim 9, wherein the differential sensing coil unit comprises:
    a first sensing coil including one end connected to one end of the differential oscillation circuit and the other end connected to a ground terminal, the first sensing coil having the first inductance;
    a second sensing coil including one end connected to the other end of the differential oscillation circuit and the other end connected to the ground terminal, the second sensing coil having the second inductance; and an intermediate connection node connected to a ground terminal at an intermediate connection position between the first sensing coil and the second sensing coil.

12. The position control device of claim 11, wherein the differential oscillation circuit comprises:

a capacitor circuit connected to the one end of the first sensing coil and the one end of the second sensing coil to form a resonance circuit together with the first sensing coil and the second sensing coil; and an oscillation circuit connected to the capacitor circuit, and configured to generate the first oscillation signal and the second oscillation signal having opposite phases.

13. The position control device of claim 9, wherein the amplitude detection circuit comprises one of an amplitude modulator and a frequency down conversion mixer.

14. The position control device of claim 9, wherein the signal processing circuit comprises:

an A/D converter configured to convert the first amplitude and the second amplitude into a digital first amplitude and a digital second amplitude; and an operation circuit configured to compensate for common distortion and to calculate the position value based on the digital first amplitude and the digital second amplitude.

15. The position control device of claim 14, wherein the operation circuit is configured to calculate the position value (PV) according to PV=(VOP−VON)/(VOP+VON), where VOP the digital first amplitude and VON is the digital second amplitude.

16. The position control device of claim 9, further comprising a calibration circuit configured to correct a variation of a corresponding value by monitoring a variation of at least one of an inductance, a capacitance, and a resistance of the differential sensing coil unit.

17. A camera module comprising:

a lens barrel;

a lens module accommodated within the lens barrel;

a conductor disposed on a side of the lens barrel;

a first inductor disposed to face the conductor and configured to generate a first inductance that is variable according to positional movement of the conductor;

a second inductor disposed to face the conductor and configured a generate a second inductance that is variable according to the positional movement of the conductor such that a sum of the first inductance and the second inductance remains constant;

circuitry configured to generate a position value associated with the conductor based on the first inductance and the second inductance; and a controller configured to control a position of the conductor based on the position value.

18. The camera module of claim 17, wherein the circuitry is configured to generate a first oscillation signal having a first amplitude based on the first inductance, to generate a second oscillation signal having a second amplitude based on the second inductance, and to calculate the position value based on the first amplitude and the second amplitude.

19. The camera module of claim 17, wherein the first inductor and the second inductor are connected to a common connection node and the connection node is grounded.

20. The camera module of claim 17, wherein the first inductor and the second inductor are spaced apart from each other along a direction that is orthogonal to a direction along which the first inductor and the second inductor face the conductor.

* * * * *